Nov. 17, 1970 D. Y. F. ZAI 3,541,463

RC ACTIVE FILTER USING UNITY GAIN AMPLIFIER

Filed Sept. 5, 1967 2 Sheets-Sheet 1

INVENTOR.
DAVID Y.F. ZAI

BY Robert G. Clay

ATTORNEY

RC ACTIVE FILTER USING UNITY GAIN AMPLIFIER

INVENTOR.
DAVID Y.F. ZAI
BY Robert S. Clay
ATTORNEY

United States Patent Office 3,541,463

Patented Nov. 17, 1970

3,541,463

RC ACTIVE FILTER USING UNITY GAIN AMPLIFIER

David Y. F. Zai, Mountain View, Calif., assignor to Ampex Corporation, Redwood City, Calif., a corporation of California Filed Sept. 5, 1967, Ser. No. 665,538
Int. Cl. H03f 3/04
U.S. Cl. 330—21 8 Claims

ABSTRACT OF THE DISCLOSURE

RC active filter circuits formed by realizing a transfer function using RC elements and a unity-gain amplifier. The filter circuits have but a single input and utilize only one transistor.

BACKGROUND OF THE INVENTION

Various RC active circuits are available in the prior art which however are generally relatively complicated and cumbersome. Typical of such prior art RC filter circuits are those described in the article by W. J. Kerwin and L. P. Huelsman, "The Design of High Performance Active RC Band-pass Filters," IEEE, International Convention Recording 14; Part 10, March 1966, pp. 74–80, N. H. Jagoda, "Active Realization of Elliptic Function Approximation," IEEE Transactions on Circuit Theory, 1962, page 423, and P. J. McVey, "Effects of Amplifier Imperfections In a Particular RC Active Network," Proc. IEE, vol. 114, No. 1, January 1967. Kerwin and Huelsman use a second-order bandstop RC active circuit as the basic building block for a high-order elliptic bandpass filter. The basic building block consists of seven or more RC elements and a voltage amplifier of positive gain greater than unity. The system was designed to provide a reduction in size and weight which would be advantageous in integrated networks while still providing the necessary isolation between stages. However, it may be seen that the circuits are relatively complicated because they utilize a non-unity gain amplifier.

Jagoda describes a filter circuit for realizing a pair of transmission zeros on the read frequency axis utilizing a low gain amplifier. His circuit was designed to provide a minimum number of components wherein however he utilizes two inputs and an amplifier of gain less than unity which complicates the circuitry with additional elements.

McVey describes an RC active circuit using a modified parallel T with a unity gain amplifier, wherein however the transmission poles are constrained by the specified transmission zeros.

SUMMARY OF THE INVENTION

The present invention provides a method of realizing a second-order transfer function building block for filter circuits, particularly a band-stop filter, using RC elements and a unity gain amplifier. The RC filter circuits which result from use of the method, utilize a single input and can realize any second-order transfer function apart from a constant multiplier. The RC filter circuits can be generally expressed in terms of a four terminal network using one voltage controlled voltage source and only one transistor. The emitter terminal of the transistor is connected as the voltage source of a unity-gain voltage amplifier. For high-order transfer functions, several sections of the circuitry may be cascaded without need of an isolation stage between sections. The basic transfer function accordingly would be $$\frac{V_2}{V_1}=\frac{y_{31}}{y_{31}+y_{34}}$$

where $V_1$ is the input voltage, $V_2$ is the output voltage, and $Y_{31}$ and $Y_{34}$ are the transfer short-circuit admittances of a four terminal network.

DESCRIPTION OF THE PREFERRED EMBODIMENTS

Figure 1:
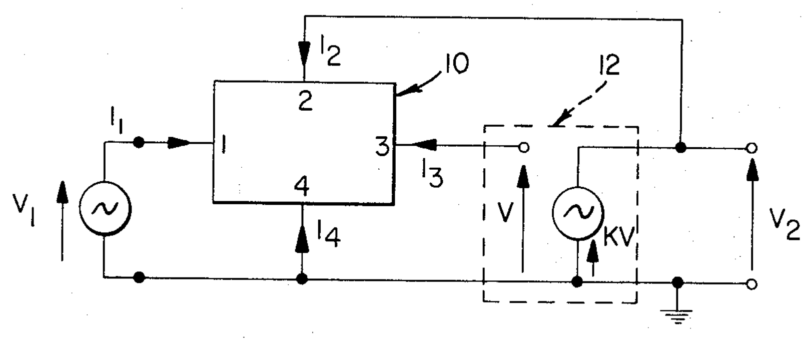
FIG. 1 is a schematic block diagram showing the basic configuration of the invention circuits, and which is utilized herein to explain the derivation of the filter circuits.

Referring to FIG. 1, consider first a four terminal network 10 constrained by a voltage controlled voltage source 12. The invention is described, by way of example only, in terms of a unity gain voltage controlled voltage source since it is practical to use an emitter-follower to realize such a source. The invention is described utilizing FIG. 1 in terms of realizing only a second-order transfer function, wherein high-order transfer functions may be obtained by cascading several sections of the circuitry such as shown in FIG. 1. However, note the invention provides a high-order transfer function without the need for an isolation stage, such as is evident in prior art devices.

Referring accordingly to FIG. 1, the four terminal network 10 may be defined by its indefinite short-circuit admittance matrix.

$$\begin{bmatrix} I_1 \\ I_2 \\ I_3 \\ I_4 \end{bmatrix} = \begin{bmatrix} y_{11}y_{12}y_{13}y_{14} \\ y_{21}y_{22}y_{23}y_{24} \\ y_{31}y_{32}y_{33}y_{34} \\ y_{41}y_{42}y_{43}y_{44} \end{bmatrix} \cdot \begin{bmatrix} V_1 \\ V_2 \\ V_3 \\ V_4 \end{bmatrix} \quad (1)$$

where $I_1$ through $I_4$ and $V_1$ through $V_4$ are the respective currents and voltages of the four terminal network. The well-known properties of this Y-matrix are $$y_{ij}=y_{ji}i,\ j=1,2,3,4$$

and (2)

$$\sum_j y_{ij}=0,\ \sum_i y_{ij}=0$$

If the amplifier is an ideal voltage-controlled voltage source (i.e., one with infinite input impedance and zero output impedance) of gain K to constrain the four-terminal network, then $$V_3=V_2/^K \text{ and } I_3=0 \quad (3)$$

Also, $V_4=0$ since terminal 4 is grounded.

Substituting equation (3) into the third row of (1), gives $$\frac{V_2}{V_1}=\frac{-Ky_{31}}{Ky_{32}+y_{33}} \quad (4)$$

where $Y_{32}$ and $Y_{33}$ are transfer short-circuit admittances. If $K=1$, we have by (2)

$$\frac{V_2}{V_1}=\frac{y_{31}}{y_{31}+y_{34}} \quad (5)$$

Figure 2:
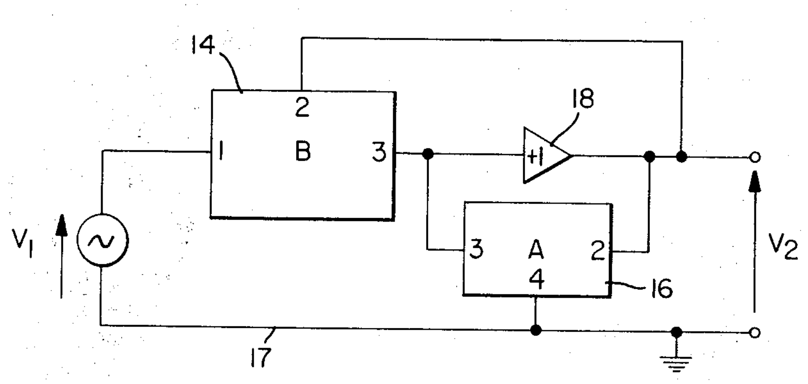
FIGS. 2 and 3 are schematic block diagrams showing, in general form, two circuits which may be derived utilizing the synthesis method of the invention.
Figure 3:
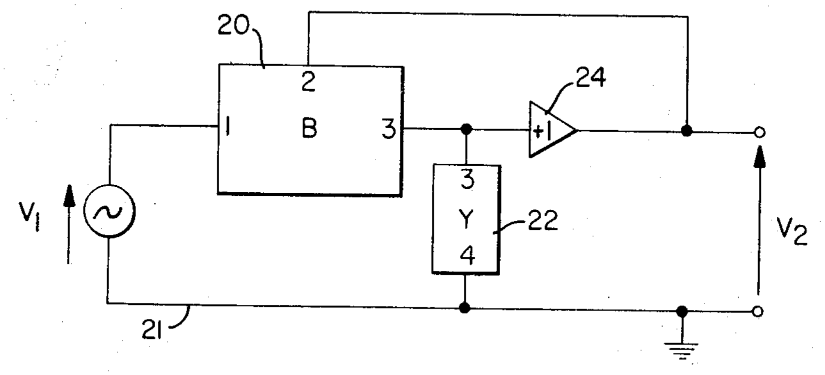

Preceding now with a further development of the concepts discussed with reference to FIG. 1, FIGS. 2 and 3, show block diagrams of two specific cases of the equation 5 of previous derivation. In FIG. 2, the four terminal network of FIG. 1 is divided into two three terminal networks and in FIG. 3 the four terminal network is divided into a three terminal network and a driving point admittance. Both the circuits of FIGS. 2 and 3 fall within the concepts of FIG. 1 and Equation 5 as further described below wherein the circuit of FIG. 3 is actually a special case of that of FIG. 2. The circuit of FIG. 3 has some constraints but provides a practical RC filter circuit utilizing a relatively small number of passive elements. The circuit of FIG. 2 on the other hand can realize any second-order transfer function, while also exhibiting a better element spread than that of FIG. 3 merely by proper choice of a common denominator for the Equation 5. Element spread is defined as the range of impedance of the circuit between the maximum and minimum impedance. It is to be understood that various other specific applications of the general concepts of Equation 5 are possible, and thus it is not intended to restrict the invention to the circuits of FIGS. 2 and 3 which are herein described by way of example as the preferred embodiments.

Accordingly, a basic configuration of one circuit of the invention is shown in FIG. 2 where the voltage transfer ratio $V_2/V_1$ is expressed as the ratio of short circuit admittance paramters. More particularly, $$\frac{V_2}{V_1}=\frac{y_{31}^{B}}{y_{31}^{B}+y_{34}^{A}} \qquad (6)$$

where the letters A and B denote the respective three terminal networks.

$$(Fs)=\frac{HD(s)}{(Ds)}$$

The circuit accordingly utilizes a three terminal network 14(B) coupled to another three terminal network 16(A). Thus terminals 3 of the networks 14 and 16 are connected together as are terminals 2 thereof. Terminal 1 of network 14 is connected to the input source $V_1$ and terminal 4 of the network 16 is grounded as at 17. The output $V_2$ is taken from the common connection between terminals 2 and ground. A unity gain amplifier 18 is connected between the common connections of terminals 3 and 2 respectively.

Referring to FIG. 3 there is shown an alternative basic circuit configuration of the invention, which utilizes a three terminal network 20(B) and a two terminal network 22(Y) which defines an RC driving point admittance. Terminals 3 of the networks 20, 22 are connected together, terminal 1 of network 20 is connected to the input source $V_1$. Terminal 4 of network 22 is connected to ground as at 21. A unity gain amplifier 24 is connected to the common point between the terminals 3, and also to the terminal 2 of the network 20 and from thence to an output terminal. The output $V_2$ is derived from the output terminal and ground 21.

The voltage transfer function of the circuit of FIG. 3 is expressed as $$\frac{V_2}{V_1}=\frac{y_{31}^{B}}{y_{31}^{B}-Y} \qquad (7)$$

where Y is the driving point admittance.

Utilizing Equation (5) of previous mention and assuming the specified transfer function to be $$F(s)=\frac{HD(s)}{D(s)}$$

the following parameters may be chosen.

$$-y_{31}^{B}=\frac{HN(s)}{Q(s)},\ \text{and}\ -y_{34}^{A}=\frac{D(s)-HN(s)}{Q(s)} \qquad (8)$$

where N($s$) is a polynomial in $s$, and D($s$) is a polynomial in $s$ with all positive coefficients. The constant H is chosen so that there is no negative numerator coefficient for $y_{34}^{A}$, and Q($s$) is an arbitrary polynomial having all the zeros on the negative real axis of the $s$-plane.

If the numerator of $y_{34}^{A}$ has negative real zeros only, then by choosing suitable Q($s$), $y_{34}^{A}$ may be simply an RC driving point admittance connected across terminal 3 and 4.

Illustrative example (FIG. 2): To realize a transfer function $$F(s)=\frac{s^2T^2+1}{as^2T^2+bsT+1}\ a>1 \qquad (9)$$

where $s$ is the complex frequency, T is a time constant, and $a$ and $b$ are positive constants.

Then $$-y_{31}^{B}=\frac{s^2T^2+1}{(sT+\sigma)}\cdot\frac{1}{R}\ T=RC$$

$$-y_{34}^{A}=\frac{(a-1)sT\left(sT+\frac{b}{(a-1)}\right)}{(sT+\sigma)}\cdot\frac{1}{R} \qquad (10)$$

where $\sigma$ is a positive constant, and RC is a time constant.

If $$\sigma=\frac{b}{2-1}$$

we have a simple capacitor for the parameter $y_{34}^{A}$ of FIG. 2, which then corresponds to Y of FIG. 3. The design may be applied to realize a high-order low-pass filter circuit, such as exemplified in FIG. 5. Thus $$f(s)=\underbrace{\frac{20}{sT+20}}_{\text{first-order}}\cdot\underbrace{\frac{0.136(s^2T^2+3.125^2)}{s^2T^2+0.2828sT+1.331}}_{\text{second-order}}\cdot\underbrace{\frac{0.312(s^2T^2+1.5625^2)}{s^2T^2+0.8272sT+0.76}}_{\text{second order}} \qquad (11)$$

where $T^{-1}=4\pi\times10^3$ rad/s, with two second-order sections in cascade.

Figure 4:
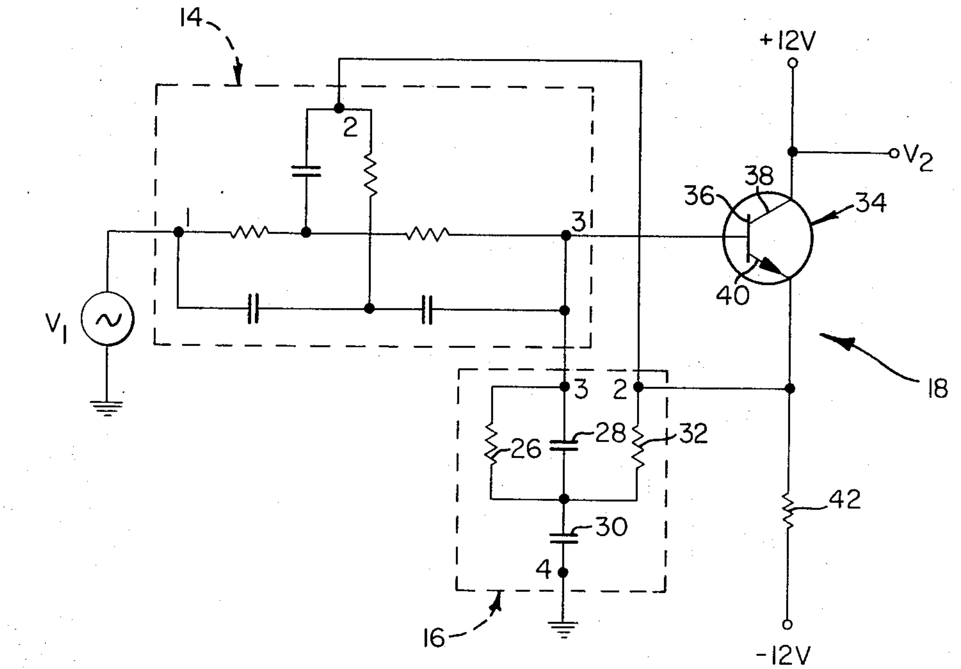
FIGS. 4 and 5 are schematic diagrams of two filter circuits corresponding to the basic block diagrams shown in FIGS. 2 and 3 respectively.

If $\sigma$ is chosen some other value in order to reduce the element spread, then $y_{34}^{A}$ will be usually still a transfer admittance. This is also applied to realize a second-order function of Equation (11) taking $\sigma=1$. The complete second-order circuit is shown in FIG. 4. Notice that the element spread here is better than that of the previously mentioned circuit of FIG. 5. This is an advantage in order to keep the element spread well away from both the input and output impedance of the voltage amplifier so that the assumption for an idea voltage-controlled voltage source still may be valid, otherwise a more sophisticated and expensive unity-gain amplifier would be required.

Referring now to FIG. 4, the circuit of FIG. 2 is shown in greater detail wherein the three terminal net work 14 is formed of a conventional parallel T circuit of the type described for example by M. P. Givens and H. S. Saby, "A Simplified Analysis of the Parallel T Null Network," Review of Scientific Instruments, vol. 18, pp. 342–246, May 1947.

The terminals 1, 2, and 3 of FIG. 4 correspond to those of FIG. 2. The three terminal network 16 is formed of a resistor 26 in parallel with a capacitor 28 wherein one common connection therebetween defines terminal 3 of the network 16, which is coupled in turn to terminal 3 of the network 14. The other common connection between resistor 26 and capacitor 28 is coupled via a capacitor 30 to ground, and the ground defines terminal 4 of network 16. The latter common connection is also connected to a resistor 32, the other end of which provides terminal 2 of network 16 which in turn is connected to terminal 2 of the network 14. The unity gain amplifier 18 is provided in the form of an emitter-follower circuit which is defined by a single transistor 34 having a base 36, a collector 38, and an emitter 40. Emitter 40 is coupled to a −12 v. source via a resistor 42, and the collector is coupled to a +12 v. source. The base of the transistor 34 is connected ot the terminals 3 of the networks 14 and 16. Thus the transistor 34 and the resistor 42 define the unity gain amplifier 18 shown in FIG. 2.

The parallel T circuit of FIG. 4 produces a pair of transmission zeros at real frequencies, that is, gives the notch in the frequency bandwidth exhibited by the filter. The network 16 formed of resistors 26, 32, and of capacitors 28, 30 defines in combination with the parallel T circuit, a pair of transmission poles.

As previously mentioned the second-order circuit shown in FIG. 4 may be cascaded without an isolation stage and with other second-order blocks to define a high-order lowpass filter circuit.

Figure 5:
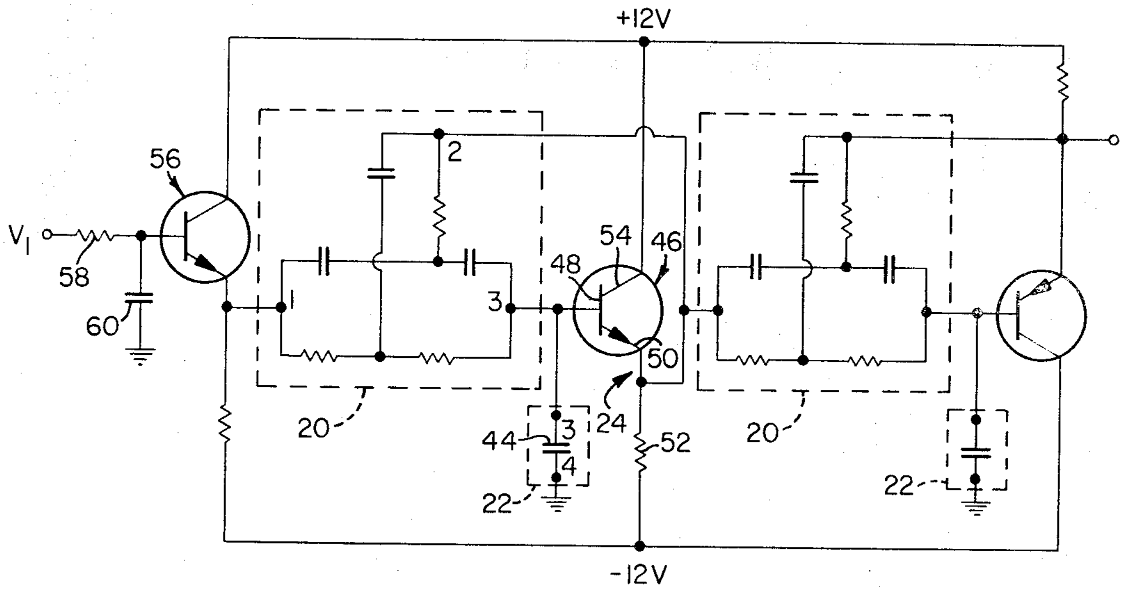

Referring to FIG. 5, there is shown an alternative second-order filter circuit in accordance with the invention, corresponding to that of FIG. 3, wherein two sections of the second-order filter circuit are cascaded along with an emitter-follower stage to thus provide a fifth-order lowpass filter. The circuit of FIG. 5 is identical to that of FIG. 4 with the exception that the three terminal network 16 is replaced by a two terminal network 22. It may be seen that the circuit of FIG. 5 is extremely simple in that the two terminal network 22 comprises simply a capacitor 44, one end of which defines terminal 3 and is coupled to terminal 3 of network 20, and the other end of which defines terminal 4 and is coupled to ground. A transistor 46, defining an emitter-follower, has a base 48 coupled to the common connection of the terminals 3 of networks 20 and 22 . An emitter 50 of transistor 46 is connected to a −12 volt source via a resistor 52 and a collector 54 is connected to a +12 volt source. Thus the transistor 46 and resistor 52 comprise the unity gain amplifier 24 of FIG. 5.

The parallel T circuit of network 20 produces a pair of transmission zeros at real frequencies and thus gives the notch in the frequency bandwidth of the filter. The capacitor 44 provides for bypass of the high frequencies of the filter and in combination with the parallel T circuit, defines a pair of transmission poles.

Two of the second-order sections are cascaded as shown to provide a fourth-order filter and the circuit is further modified with another transistor 56 connected in the form of an emitter-follower between the positive and negative 12 volt source, and connected at its base to a resistor and from thence to the input source $V_1$. A capacitor 60 is connected to the junction between the resistor 58 and the transistor 56 and is coupled to ground. Thus a fifth-order lowpass filter is provided in FIG. 5 utilizing the concepts of the invention. It may be seen that the unity gain amplifiers are directly connected to the succeeding networks 20 with no need for an isolation stage therebetween as in some prior art devices. Furthermore, the circuit of FIG. 5 is extremely simple in that network 22 comprises simply a capacitor. In addition, a unity gain amplifier such as exemplified by numerals 18 and 24 is extremely simple relative to amplifiers of gain K such as is utilized in prior art devices.

Although the invention has been described herein with reference to several embodiments, it is to be understood that various modifications may be made thereto within the spirit of the invention. Thus it is not intended to limit the invention except as defined in the following claims.

What is claimed is:

1. An RC active circuit for use in forming high order elliptic filter circuits having an input voltage $V_1$ and an output voltage $V_2$, comprising:

a four terminal network having first, second, third and fourth terminals and including therein a first three terminal network having three of said four terminals, a second multi-terminal network coupled to the first three terminal network, and a unity gain voltage controlled voltage source amplifier including a transistor having an emitter, base and collector operatively coupled to said second multi-terminal network and also coupled to said four terminal network in a feedback relationship, wherein the voltage transfer ratio of said circuit is defined by $$\frac{V_2}{V_1}=\frac{Y_{31}}{Y_{31}+Y_{34}}$$

where $Y_{31}$ and $Y_{34}$ are the transfer short-circuit admittances of said four terminal network.

2. The RC active circuit of claim 1 wherein said circuit defines a second-order transfer function, wherein a plurality of said circuits can be directly cascaded together to define a high-order transfer function.

3. The RC active circuit of claim 1 wherein the second multi-terminal network comprises a second three terminal network coupled to said first three terminal network and to said unity gain amplifier, wherein the voltage transfer ratio of the circuit is further defined as $$\frac{V_2}{V_1}=\frac{Y_{31}{}^{B}}{Y_{31}{}^{B}+Y_{34}{}^{A}}$$

where $Y_{31B}$ is the transfer short-circuit admittance of the first three terminal network, and $Y_{34A}$ is the transfer short-circuit admittance of the second three terminal network.

4. The RC active circuit of claim 3 wherein the first three terminal network includes the first, second and third terminals, said second three terminal network includes the second, third and fourth terminals, wherein said second and third terminals of each network are coupled together, said first terminal is coupled to the input voltage $V_1$, the fourth terminal is grounded, and said unity gain amplifier is connected between the junctions of said second and third terminals.

5. The RC active circuit of claim 4 wherein said first three terminal network comprises a parallel T circuit, said second three terminal network comprises a pair of capacitors connected in electrical series, a resistor connected in parallel with one capacitor, the free end of the other capacitor being connected to ground and defining the fourth terminal, the junction of the free ends of the capacitor and parallel resistor defining said third terminal, and a resistor connected at one end to the junction between the series capacitors, the other end thereof defining said second terminal which is coupled to the emitter of the transistor.

6. The RC active circuit of claim 1 wherein the second multi-terminal network comprises a two terminal network coupled to said first three terminal network and to said unity gain amplifier, wherein the voltage transfer ratio is further defined as $$\frac{V_2}{V_1}=\frac{Y_{31}{}^{B}}{Y_{31}{}^{B}-Y}$$

where Y is the driving point admittance.

7. The RC active circuit of claim 6 wherein the first three terminal network includes the first, second and third terminals, said two terminal network includes the third and fourth terminals, wherein said third terminals of each network are coupled together, said first terminal is coupled to the input source $V_1$, said fourth terminal is grounded, and the unity gain amplifier is coupled between the junction of the third terminals and the second terminal of said first three terminal network.

8. The RC active circuit of claim 7 wherein said first three terminal network comprises a parallel T circuit, said two terminal network comprises a capacitor, one end of said capacitor defining the third terminal and being coupled to the base of said transistor, the other end of the capacitor defining the fourth terminal and being coupled to ground.

References Cited

UNITED STATES PATENTS 3,411,098 11/1968 Perra ------------- 330—31 X

ROY LAKE, Primary Examiner

LAWRENCE J. DAHL, Assistant Examiner

U.S. Cl. X.R.

330—31